United States Patent
Chen et al.

(10) Patent No.: US 9,433,287 B2
(45) Date of Patent: Sep. 6, 2016

(54) FLAT PANEL DISPLAY DEVICE AND SUPPORT BASE THEREOF

(71) Applicant: SHENZHEN TCL NEW TECHNOLOGY CO., LTD, Shenzhen, Guangdong (CN)

(72) Inventors: Zhanyuan Chen, Shenzhen (CN); Jianmin Xu, Shenzhen (CN); Futao Deng, Shenzhen (CN)

(73) Assignee: SHENZHEN TCL NEW TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 14/428,009

(22) PCT Filed: Sep. 5, 2013

(86) PCT No.: PCT/CN2013/082965
§ 371 (c)(1),
(2) Date: Mar. 13, 2015

(87) PCT Pub. No.: WO2014/040512
PCT Pub. Date: Mar. 20, 2014

(65) Prior Publication Data
US 2015/0257535 A1 Sep. 17, 2015

(30) Foreign Application Priority Data
Sep. 14, 2012 (CN) .................... 2012 2 0470221 U

(51) Int. Cl.
*A47B 81/06* (2006.01)
*F16M 11/38* (2006.01)
(Continued)

(52) U.S. Cl.
CPC ............. *A47B 81/06* (2013.01); *A47B 23/044* (2013.01); *A47B 97/08* (2013.01); *F16M 11/38* (2013.01);
(Continued)

(58) Field of Classification Search
CPC .................................................... G06F 1/1632
USPC ....... 248/164, 166, 431, 432, 167, 434, 435, 248/176.3, 441.1, 458, 459, 460, 462, 676, 248/447, 450, 451, 452, 453, 168, 170; 361/679.41–679.44, 679.02
See application file for complete search history.

(56) References Cited

U.S. PATENT DOCUMENTS 6,819,548 B2 * 11/2004 Hillis .................... A47B 23/042
361/679.44
7,514,616 B2 * 4/2009 Sawhney ................. G10G 5/00
248/443

(Continued)

OTHER PUBLICATIONS

International Search Report of PCT Patent Application No. PCT/CN2013/082965 issued on Nov. 28, 2013.

*Primary Examiner* — Anthony Haughton

(57) ABSTRACT

The present disclosure discloses a flat-panel display device and a supporting base seat thereof. The supporting base seat includes a first structure member and a second structure member; the first structure member and the second structure member are symmetrical, and the first structure member is axisymmetrically hinged to the second structure member; a first hinging portion is arranged on bottom rear sides of the first structure member and the second structure member; a second hinging portion is arranged at top ends of the first structure member and the second structure member, and a maximum hinged included angle is smaller than 180 degrees; the supporting base seat is a triangular cone-shaped frame structure when unfolded; a first clamping hook extends out of a bottom front side of the first structure member, and a second clamping hook extends out of a bottom front side of the second structure member.

16 Claims, 6 Drawing Sheets

(51) Int. Cl.
  *F16M 13/00* (2006.01)
  *A47B 23/04* (2006.01)
  *A47B 97/08* (2006.01)
  *H05K 5/00* (2006.01)
  *H05K 5/02* (2006.01)

(52) U.S. Cl.
  CPC ............ *F16M 13/00* (2013.01); *H05K 5/0017* (2013.01); *H05K 5/0226* (2013.01); *A47B 2200/04* (2013.01); *A47B 2220/0019* (2013.01)

(56) References Cited

U.S. PATENT DOCUMENTS

| | | | | |
|---|---|---|---|---|
| 7,940,523 | B2 * | 5/2011 | Morooka | G06F 1/1632 361/679.07 |
| 8,004,834 | B2 * | 8/2011 | Shih | G06F 1/1632 248/917 |
| 8,146,870 | B1 * | 4/2012 | Cooper | G10G 5/00 248/150 |
| 8,576,557 | B2 * | 11/2013 | Chu | F16M 13/00 361/679.26 |
| 8,724,312 | B2 * | 5/2014 | Jones | G06F 1/1632 361/679.41 |
| 8,820,695 | B2 * | 9/2014 | Nakada | A45C 11/00 206/45.2 |
| 8,891,232 | B2 * | 11/2014 | Wang | G06F 1/1637 248/121 |
| 9,010,700 | B1 * | 4/2015 | Cooper | G10G 5/00 248/166 |
| 9,010,701 | B1 * | 4/2015 | Cooper | A47B 23/042 248/166 |
| 2009/0179124 | A1 | 7/2009 | Caplan | |
| 2011/0170246 | A1 | 7/2011 | Chu | |
| 2013/0306807 | A1 * | 11/2013 | Liang | A47B 23/043 248/124.1 |
| 2014/0175253 | A1 * | 6/2014 | Huang | F16M 11/105 248/558 |

* cited by examiner

FLAT PANEL DISPLAY DEVICE AND SUPPORT BASE THEREOF

FIELD OF THE INVENTION

The present invention generally relates to the fields of flat-panel display technologies and, more particularly, to a flat-panel display device and a supporting base seat thereof.

BACKGROUND

With the development of flat-panel display technologies, the demand for flat-panel TV is growing. The flat-panel TV is widely used by user in public or at home. It is needed to hang on the wall or stand on a table when the flat-panel TV is used. In order to keep the TV upright, a base seat is needed to support the TV. At present, the base seat to support the TV in the market takes up too much space; when being packed, large capacity is occupied by the base seat. Therefore, it causes inconvenience in the process of packing and transportation. In addition, the base seat of the TV used in the flat-panel display production is usually screwed to a bracket of the base seat, and then the bracket is connected to a display by bolt, thereby keeping the TV upright. However, such way of keeping the TV upright is inconvenient for user to operate, because special tools are required in such way. Furthermore, it is very inconvenient when it needs to disassemble the base seat so as to move the TV.

BRIEF SUMMARY OF THE DISCLOSURE

One main purpose of the present disclosure is to provide a flat-panel display device and a supporting base seat thereof, which are capable of saving occupied space and convenient to be disassembled.

The present disclosure provides a flat-panel display device and a supporting base seat thereof. The supporting base seat includes a first structure member and a second structure member; shapes of the first structure member and the second structure member are symmetrical, and the first structure member is hinged to the second structure member in an axial symmetrical mode; a first hinging portion is arranged on a bottom rear side of the first structure member and a bottom rear side of the second structure member; a second hinging portion is arranged at a top end of the first structure member and a top end of the second structure member, and a maximum hinged included angle is smaller than 180 degrees; the supporting base seat is a triangular cone-shaped frame structure when unfolded; a first clamping hook extends out of a bottom front side of the first structure member, and a second clamping hook extends out of a bottom front side of the second structure member.

Preferably, the first structure member and the second structure member are triangular plate-shaped structures.

Preferably, the first structure member and the second structure member are L-shaped, an angle formed between two arms of the first structure member is an acute angle, and an angle formed between two arms of the second structure member is equal to the angle formed between the two arms of the first structure member.

Preferably, the first hinging portion includes a door pivot, a first lantern ring arranged on the bottom rear side of the first structure member, and a third lantern ring arranged on the bottom rear side of the second structure member; the third lantern ring engages with the first lantern ring, the door pivot extends through the first lantern ring and the third lantern ring;

the second hinging portion includes a screw, a second lantern ring arranged on the top end of the first structure member, and a forth lantern ring arranged on the top end of the second structure member; the forth lantern ring engages with the second lantern ring, and the screw is in clearance fit with the fourth lantern ring after being connected to threads of the second lantern ring.

Preferably, a first gasket is arranged between the first lantern ring and the third lantern ring, and a second gasket is arranged between the second lantern ring and the forth lantern ring.

Preferably, the supporting base seat further includes a decoration strip, the decoration strip is connected between the first clamping hook and the second clamping hook, a first clamping groove and a second clamping groove are respectively arranged in two ends of the decoration strip, the first clamping hook is clamped in the first clamping groove, and the second clamping hook is clamped in the second clamping groove.

Preferably, a first spring clamping column is arranged at the first clamping groove, a third clamping groove is arranged at a side of the first clamping hook corresponding to the first spring clamping column, and the first spring clamping column extends into the third clamping groove when the first clamping hook is clamped in the first clamping groove;

a second spring clamping column is arranged at the second clamping groove, a forth clamping groove is arranged at a side of the second clamping hook corresponding to the second spring clamping column, and the second spring clamping column extends into the forth clamping groove when the second clamping hook is clamped in the second clamping groove.

Preferably, magnets are respectively arranged on the top ends of the first structure member and the second structure member.

Preferably, a first clamping hole and a first rubber cushion being in interference fit with the first clamping hole are respectively arranged at bottom parts of the first structure member and the second structure member, a second clamping hole and a second rubber cushion being in interference fit with the second clamping hole are respectively arranged above the first clamping hook and the second clamping hook.

The present disclosure further provides a flat-panel display device including a display panel. The flat-panel display device further includes a supporting base seat, the supporting base seat includes a first structure member and a second structure member; shapes of the first structure member and the second structure member are symmetrical, and the first structure member is hinged to the second structure member in an axial symmetrical mode; a first hinging portion is arranged on a bottom rear side of the first structure member and a bottom rear side of the second structure member; a second hinging portion is arranged at a top end of the first structure member and a top end of the second structure member, and a maximum hinged included angle is smaller than 180 degrees; the supporting base seat is a triangular cone-shaped frame structure when unfolded; a first clamping hook extends out of a bottom front side of the first structure member, and a second clamping hook extends out of a bottom front side of the second structure member.

Preferably, the first structure member and the second structure member are triangular plate-shaped structures.

Preferably, the first structure member and the second structure member are L-shaped, an angle formed between two arms of the first structure member is an acute angle, and an angle formed between two arms of the second structure member is equal to the angle formed between the two arms of the first structure member.

Preferably, the first hinging portion includes a door pivot, a first lantern ring arranged on of the bottom rear side of the first structure member, and a third lantern ring arranged on the bottom rear side of the second structure member; the third lantern ring engages with the first lantern ring, and the door pivot extends through the first lantern ring and the third lantern ring;

the second hinging portion includes a screw, a second lantern ring arranged on the top end of the first structure member, and a forth lantern ring arranged on the top end of the second structure member; the forth lantern ring engages with the second lantern ring, the screw is in clearance fit with the fourth lantern ring after being connected to threads of the second lantern ring.

Preferably, a first gasket is arranged between the first lantern ring and the third lantern ring, and a second gasket is arranged between the second lantern ring and the forth lantern ring.

Preferably, the flat-panel display device further includes a decoration strip, the decoration strip is connected between the first clamping hook and the second clamping hook, a first clamping groove and a second clamping groove are respectively arranged in two ends of the decoration strip, the first clamping hook is clamped in the first clamping groove, the second clamping hook is clamped in the second clamping groove.

Preferably, a first spring clamping column is arranged at the first clamping groove, a third clamping groove is arranged at a side of the first clamping hook corresponding to the first spring clamping column, and the first spring clamping column extends into the third clamping groove when the first clamping hook is clamped in the first clamping groove;

a second spring clamping column is arranged at the second clamping groove, a forth clamping groove is arranged at a side of the second clamping hook corresponding to the second spring clamping column, and the second spring clamping column extends into the forth clamping groove when the second clamping hook is clamped in the second clamping groove.

Preferably, two magnets are respectively arranged on the top ends of the first structure member and the second structure member.

Preferably, a first clamping hole and a first rubber cushion being in interference fit with the first clamping hole are respectively arranged at bottom parts of the first structure member and the second structure member; a second clamping hole and a second rubber cushion being in interference fit with the second clamping hole are respectively arranged above the first clamping hook and the second clamping hook.

With the axial symmetrical hinged structure between the first structure member and the second structure member of the supporting base seat, the first structure member and the second structure member can be folded and unfolded. When the flat-panel display device and the supporting base seat thereof are in use, the first structure member and the second structure member are unfolded to form the triangular cone-shaped frame structure, therefore the flat-panel display device and the supporting base seat thereof are convenient to be assembled and capable of being placed on a table, and stability is ensured. When the flat-panel display device and the supporting base seat thereof need to be packed in a box, the first structure member and the second structure member are folded, and therefore the flat-panel display device and the supporting base seat thereof are convenient to be disassembled and capable of saving occupied space.

Other aspects of the present disclosure can be understood by those skilled in the art in light of the description, the claims, and the drawings of the present disclosure.

In order to describe the technical solution of the embodiments of the present invention more clearly, said drawings used in the description of the embodiments are introduced. The drawings described are merely exemplary embodiments of the present invention. For those skilled in the art, on the premise of no inventive effort being involved, other drawings may also be obtained according to these drawings and the descriptions included herein.

DETAILED DESCRIPTION

In the following description, for purposes of illustration, many specific details are illustrated in order to provide a full understanding of one or more embodiments. However, obviously, those embodiments can also be implemented in the case of these specific details changed, replaced, or alternated. The followings, together with accompanying drawings, describe in detail certain embodiments of the present invention.

Figure 1A:
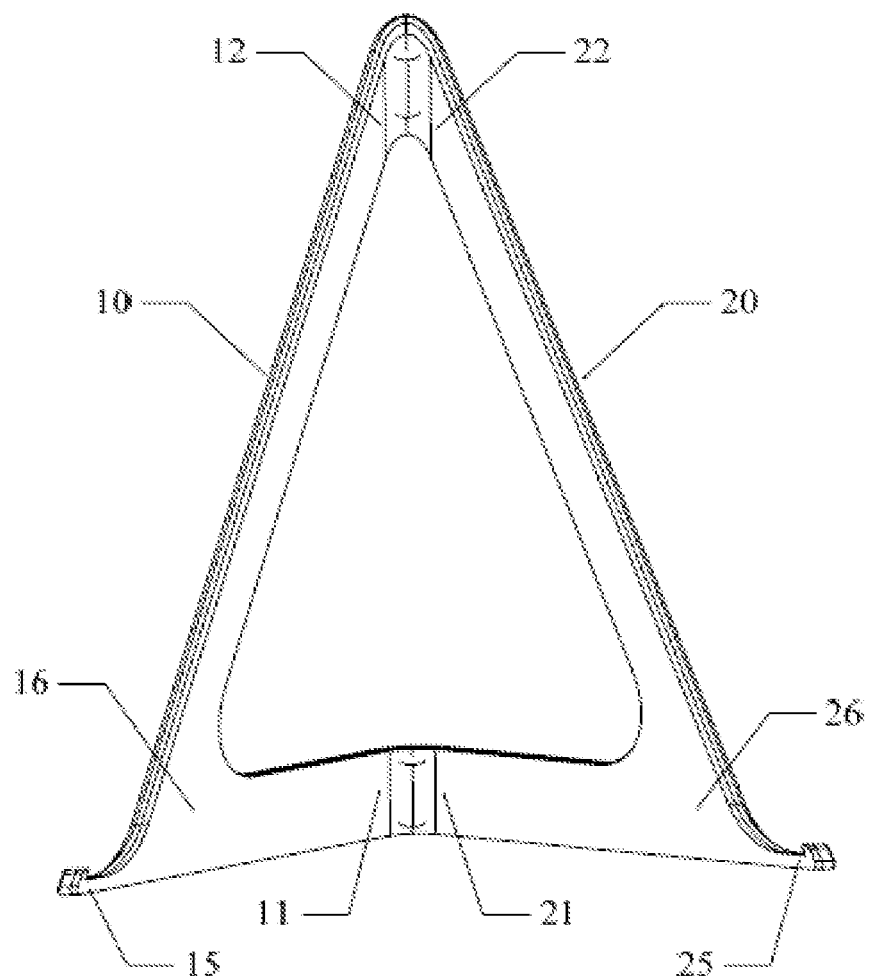
FIG. 1(a) illustrates a schematic diagram of a first structure member and a second structure member of a supporting base seat in unfolded states according to a first embodiment of the present invention.
Figure 1B:
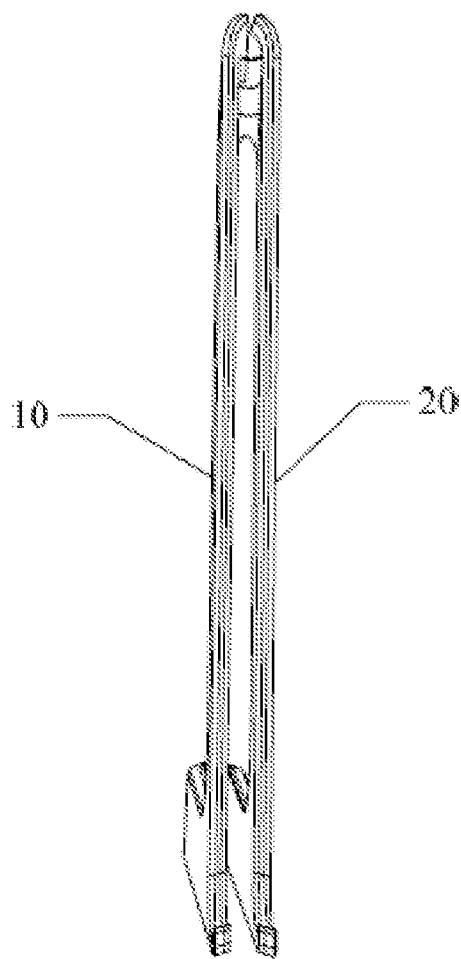
FIG. 1(b) illustrates a schematic diagram of the first structure member and the second structure member of the supporting base seat in folded states according to the first embodiment of the present invention.

FIG. 1(a) illustrates a schematic diagram of a first structure member and a second structure member of a supporting base seat in unfolded states according to a first embodiment of the present invention; FIG. 1(b) illustrates a schematic diagram of a first structure member and a second structure member of the supporting base seat in folded states according to the first embodiment of the present invention.

The supporting base seat in the embodiment includes a first structure member 10 and a second structure member 20; shapes of the first structure member 10 and the second structure member 20 are symmetrical, and the first structure member 10 is hinged to the second structure member 20 in an axial symmetrical mode. A first hinging portion is arranged on a bottom rear side 11 of the first structure member 10 and a bottom rear side 21 of the second structure member 20, a second hinging portion is arranged at a top end 12 of the first structure member 10 and a top end 22 of the second structure member 20, and the maximum hinged included angle is smaller than 180 degrees. A first clamping hook 15 extends out of a bottom front side 16 of the first structure member 10, and a second clamping hook 25 extends out of a bottom front side 26 of the second structure member 20. Based on L-shape structures, the first structure member and the second structure member are designed to be L-shaped; with the axial symmetrical structure formed by the first structure member 10 and the second structure member 20, the first structure member 10 and the second structure member 20 can be folded and unfolded. When the flat-panel display device and the supporting base seat thereof are in use, the first structure member 10 and the second structure member 20 are unfolded; since the maximum hinged included angle is smaller than 180 degrees, the unfolded supporting base seat is shown as a triangular cone-shaped frame structure. Thus, the supporting base seat is convenient to be assembled and stability is ensured; in addition, the supporting base seat is capable of keeping upright on a table, and a display panel of the flat-panel display device lies on the supporting base seat. Since the first clamping hook 15 and the second clamping hook 25 abut a front end of a frame of the display panel, the display panel can be prevented from sliding off the frame. When the supporting base seat needs to be packed in a box, the first structure member 10 and the second structure member 20 are folded, and therefore the flat-panel display device and the supporting base seat thereof are convenient to be disassembled and capable of saving occupied space.

Figure 2:
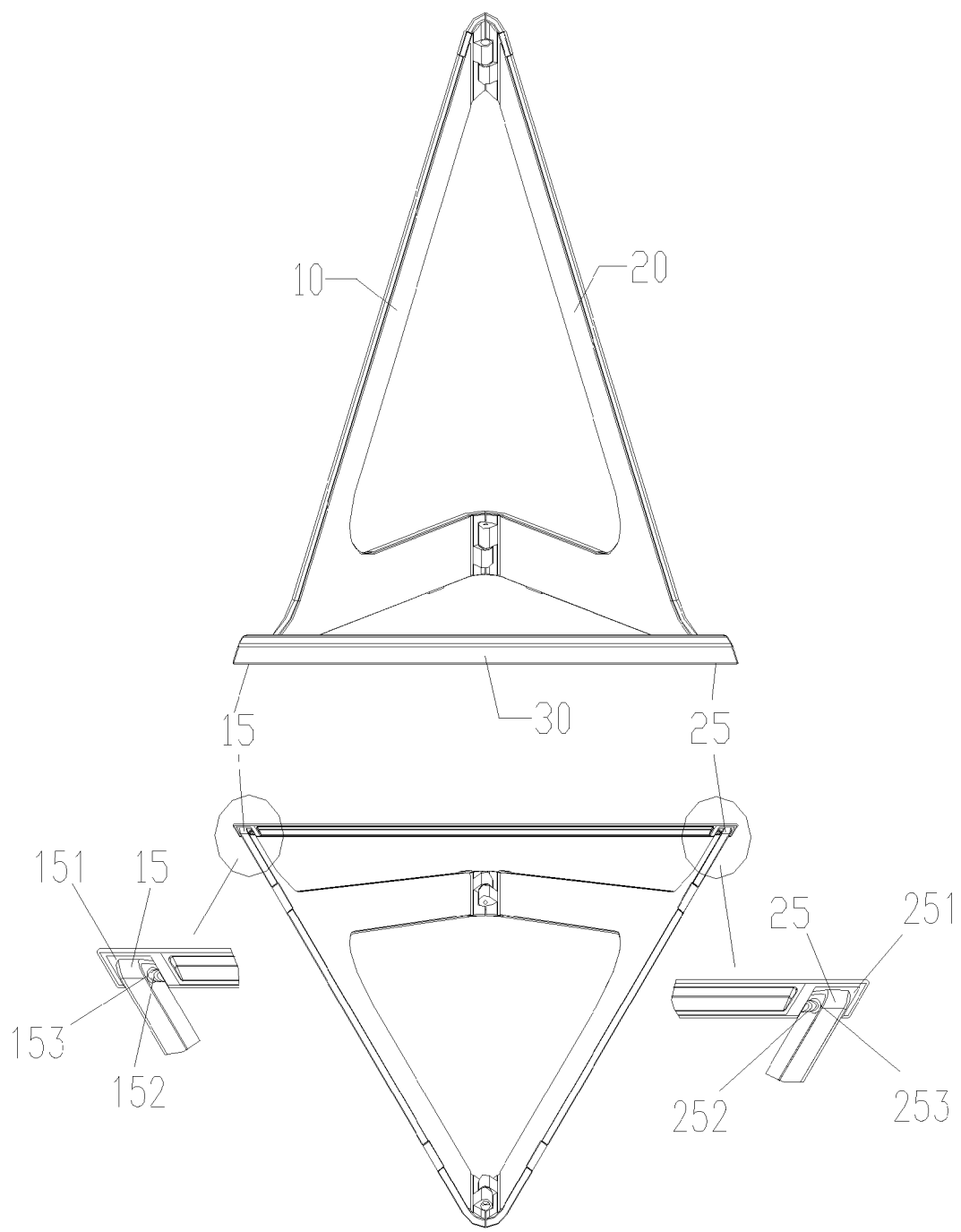
FIG. 2 illustrates a schematic diagram of the first structure member and the second structure member of the supporting base seat in unfolded states with a decoration strip according to the first embodiment of the present invention.

As shown in FIG. 2, FIG. 2 illustrates a schematic diagram of the first structure member and the second structure member in folded states with a decoration strip according to the first embodiment of the supporting base seat in the present invention. Base on the embodiment shown in FIGS. 1(a) and 1(b), the supporting base seat also includes a decoration strip 30. The decoration strip 30 is connected between the first clamping hook 15 and the second clamping hook 25. A first clamping groove 151 and a second clamping groove 251 are respectively arranged in two ends of the decoration strip 30. The first clamping hook 15 is clamped in the first clamping groove 151, and the second clamping hook 25 is clamped in the second clamping groove 251. On one hand, the decoration strip 30 fastens the first structure member 10 to the second structure member 20; the first structure member 10, the second structure member 20, and the decoration strip 30 form a triangular cone-shaped frame structure so as to ensure the stability of the whole supporting base seat. On the other hand, when the display panel of the flat-panel display device 1 is placed on the supporting base seat, the decoration strip 30 abuts the front side of a bottom frame of the display panel, thereby effectively preventing the display panel from sliding off. Furthermore, to further prevent the decoration strip 30 from disengaging from the first clamping hook 15 and the second clamping hook 25, a first spring clamping column 152 is arranged at the first clamping groove 151, and a second spring clamping column 252 is arranged at the second clamping groove 251. A third clamping groove 153 is arranged at a side of the first clamping hook 15 corresponding to the first spring clamping column 152, and the first spring clamping column 152 extends into the third clamping groove 153 when the first clamping hook 15 is clamped in the first clamping groove 151. A forth clamping groove 253 is arranged at a side of the second clamping hook 25 corresponding to the second spring clamping column 252, and the second spring clamping column 252 extends into the forth clamping groove 253 when the second clamping hook 25 is clamped in the second clamping groove 251.

Figure 3:
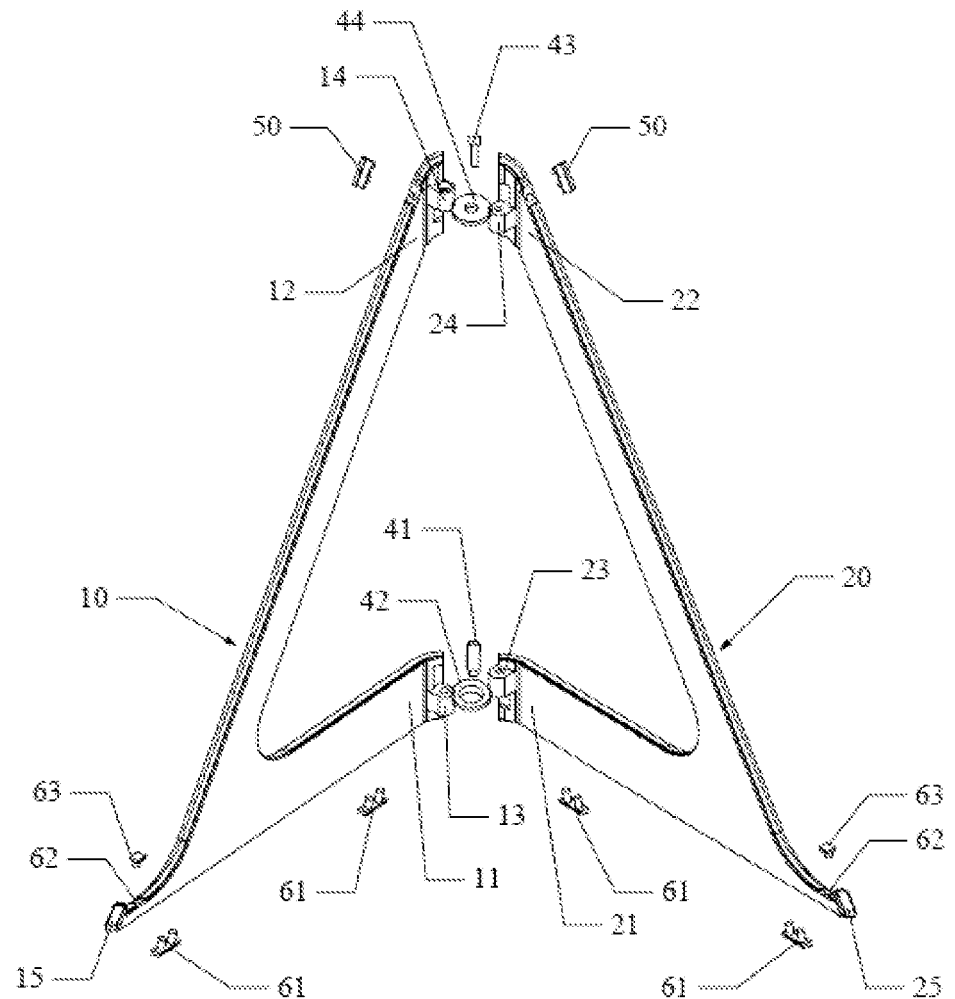
FIG. 3 illustrates an explosive view of the first structure member and the second structure member of the supporting base seat according to the first embodiment of the present invention.

As shown in FIG. 3, FIG. 3 illustrates an explosive view of the first structure member and the second structure member of the supporting base seat according to the first embodiment of the present invention.

The L-shaped first structure member 10 has an acute angle formed between the two arms of the first structure member, and the L-shaped second structure member 20 has also an acute angle formed between the two arms of the second structure member, and the angle formed between the two arms of the second structure member is equal to the angle formed between the two arms of the first structure member.

The first hinging portion includes a door pivot 41, a first lantern ring 13 arranged on the bottom rear side of the first structure member 10, and a third lantern ring 23 arranged on the bottom rear side of the second structure member 20. The third lantern ring 23 engages with the first lantern ring 13, and the door pivot 41 extends through the first lantern ring 13 and the third lantern ring 23. The door pivot 41 is an elastic mechanism to ensure that there is some elasticity when the first structure member 10 and the second structure member 20 are unfolded or folded and that the first structure member 10 and the second structure member 20 are not easily returned to their original positions. Furthermore, a first gasket 42 is arranged between the first lantern ring 13 and the third lantern ring 23 for separating the first lantern ring 13 from the third lantern ring 23, for example, when the first lantern ring 13 and the third lantern ring 23 are metal parts such as aluminum parts, the gasket 42 can prevent wearing caused by the friction between the first lantern ring 13 and the third lantern ring 23.

The second hinging portion includes a screw 43, a second lantern ring 14 arranged on the top end 12 of the first structure member 10, and a forth lantern ring 24 arranged on the top end 22 of the second structure member 20. The forth lantern ring 24 engages with the second lantern ring 14. Threads are formed on the inner surface of the second lantern ring 14, and the screw 43 is screwed to the threads of the second lantern ring 14 to form an integral rotor. One part of the screw thread 43 extending out of the second lantern ring 14 passes through the forth lantern ring 24 to be in clearance fit with the forth lantern ring 24. In this way, the forth lantern ring 24 acts as a rotatable spin axis. According to the embodiment, the first structure member 10 and the second structure member 20 can be unfolded or folded by the hinged structure between the rotor and the spin axis. When the flat-panel display device and the supporting base seat thereof are in use, the first structure member 10 and the second structure member 20 are unfolded, forming the triangular cone-shaped frame structure, thus, the supporting base seat thereof are convenient to be assembled and the stability is ensured. When the supporting base seat needs to be packed in a box, the first structure member 10 and the second structure member 20 are folded, and therefore the flat-panel display device and the supporting base seat thereof are convenient to be disassembled and capable of saving occupied space. Furthermore, a second gasket 44 is arranged between the second lantern ring 14 and the forth lantern ring 24 for separating the second lantern ring 14 from the forth lantern ring 24, for example, when the second lantern ring 14 and the forth lantern ring 24 are metal parts such as aluminum parts, the second gasket 44 can prevent the wearing caused by the friction between the second lantern ring 14 and the forth lantern ring 24.

Magnets 50 are respectively arranged on the top end 12 of the first structure member 10 and the top end 22 of the second structure member 20. A metal back shell of the display panel in the flat-panel display device can be attracted by magnets 50 so as to strengthen the stability of the display panel in the flat-panel display device on the supporting base seat, and to further prevent the display panel from sliding off.

A first clamping hole and a first rubber cushion 61 being in interference fit with the first clamping hole are respectively arranged at a bottom part of the first structure member 10 and a bottom part of the second structure member 20, which can prevent the supporting base seat from sliding on the table. At the same time, the first rubber cushion 61 is an elastic element, the external diameter of the first rubber cushion 61 is bigger than the internal diameter of the first clamping hole, thus, the first rubber cushion 61 is in interference fit with the first clamping hole to prevent the first rubber cushion 61 from easily sliding from the first clamping hole. A second clamping hole 62 and a second rubber cushion 63 being in interference fit with the second clamping hole 62 are respectively arranged on the first clamping hook 15 and the second clamping hook 25. When the supporting base seat includes a decoration strip, the second clamping hole 62 and the second rubber cushion 63 are respectively located at the rear sides of the decoration strips of the first structure member 10 and the second structure member 20. When the display panel in flat-panel display device is placed on the supporting base seat, the bottom part of the display panel is located above the second rubber cushion 63, preventing the display panel sliding off.

Figure 4:
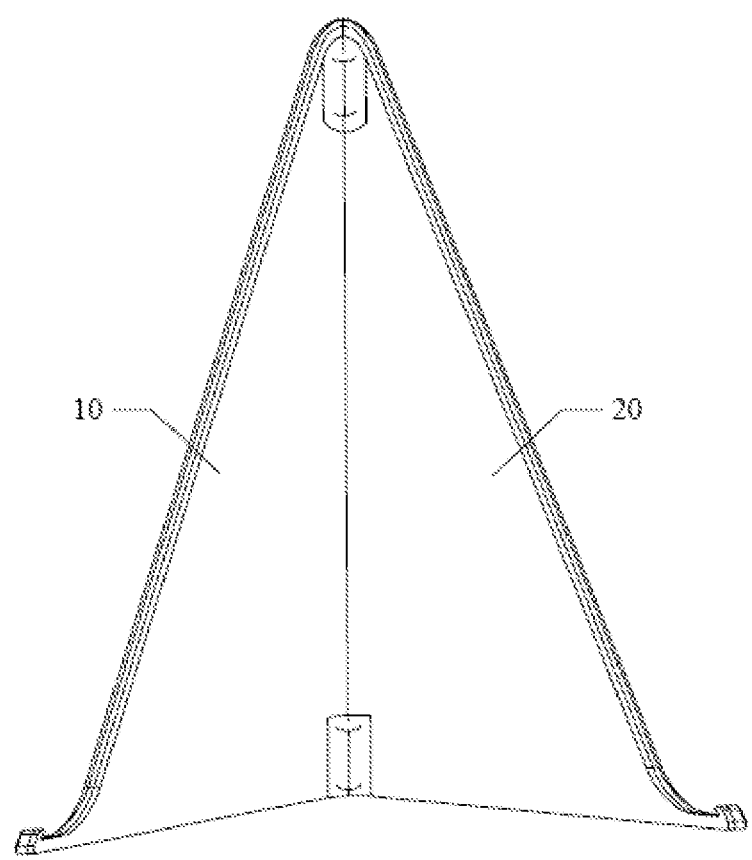
FIG. 4 illustrates a schematic diagram of a first structure member and a second structure member of a supporting base seat in unfolded states according to a second embodiment of the present invention.

As shown in FIG. 4, FIG. 4 illustrates a schematic diagram of a first structure member and a second structure member of the supporting base seat in unfolded states according to a second embodiment of the supporting base seat. The difference between the present embodiment and the first embodiment is: the first structure member 10 and the second structure member 20 are respectively triangular plate-shaped structures. It can still realize that the supporting base seat when folded is convenient to be assembled and is stably placed. When the supporting base seat needs to be packed in a box, the supporting base seat thereof is convenient to be disassembled and capable of saving occupied space. At the same time, in order to stably place the display panel in the flat-panel display device, the triangular plate-shaped structure is an acute-triangle structure or a rectangular-triangle structure, that is, each angle of the structure is smaller than or equal to 90 degrees. Furthermore, with the triangular plate-shaped structure, the first structure member 10 and the second structure member 20 are more stable than the L-shaped structure in the first embodiment, and are harder to be damaged.

Figure 5:
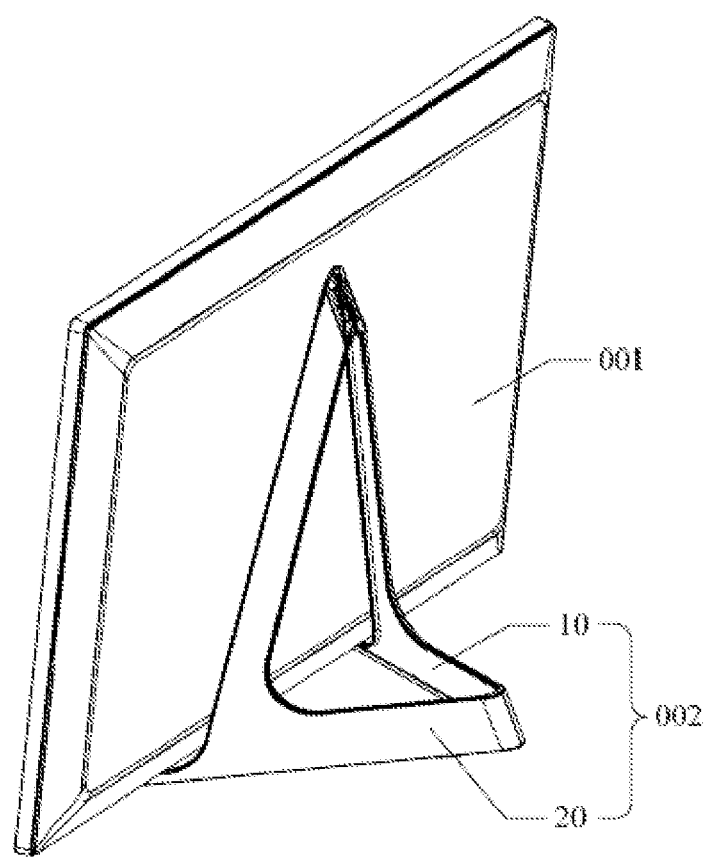
FIG. 5 illustrates an installation diagram of the flat-panel display device in the present invention.

As shown in FIG. 5, FIG. 5 illustrates an installation diagram of the flat-panel display device in the present invention. The flat-panel display device in the present invention includes a display panel 001 and a supporting base seat 002. The supporting base seat 002 includes a first structure member 10 and a second structure member 20. The shapes of the first structure member 10 and the second structure member 20 are symmetrical, and the first structure member is hinged to the second structure member in an axial symmetrical mode. A first hinging portion is arranged on a bottom rear side 11 of the first structure member 10 and a bottom rear side 21 of the second structure member 20, a second hinging portion is arranged at a top end of the first structure member 10 and a top end of the second structure member 20, and the maximum hinged included angle is smaller than 180 degrees. The supporting base seat is a triangular cone-shaped frame structure when unfolded; a first clamping hook extends out of a bottom front side of the first structure member 10, and a second clamping hook extends out of a bottom front side of the second structure member.

The supporting base seat included in the flat-panel display device in the present invention includes the technical solution of said embodiments shown in FIG. 1(a), FIG. 1(b), FIG. 2, FIG. 3, and FIG. 4. For detailed structures of the supporting base seat, please refer to said embodiments, which are not repeated herein. Due to the supporting base seat, compared with the existing flat-panel display device, the supporting base seat of the present invention is convenient to be assembled and disassembled, the stability of the supporting base seat is ensured, and the supporting base seat is capable of saving occupied space.

The above described embodiments are only for illustrative purposes. It should be noted that those skilled in the art, without departing from the principles of the present disclosure, may make certain improvements and modifications, and these improvements and modifications should also be considered within the scope of the disclosure. Other applications, advantages, alternations, modifications, or equivalents to the disclosed embodiments are obvious to those skilled in the art.

What is claimed is:

1. A supporting base seat, wherein the supporting base seat comprises a first structure member and a second structure member; shapes of the first structure member and the second structure member are symmetrical, and the first structure member is hinged to the second structure member in an axial symmetrical mode; a first hinging portion is arranged on a bottom rear side of the first structure member and a bottom rear side of the second structure member; a second hinging portion is arranged at a top end of the first structure member and a top end of the second structure member, and a maximum hinged included angle is smaller than 180 degrees; the supporting base seat is a triangular cone-shaped frame structure when unfolded; a first clamping hook extends out of a bottom front side of the first structure member, and a second clamping hook extends out of a bottom front side of the second structure member;

wherein, the first hinging portion comprises a door pivot that is an elastic mechanism, a first lantern ring arranged on the bottom rear side of the first structure member, and a third lantern ring arranged on the bottom rear side of the second structure member; the third lantern ring engages with the first lantern ring, the door pivot extends through the first lantern ring and the third lantern ring;

the second hinging portion comprises a screw, a second lantern ring arranged on the top end of the first structure member, and a forth lantern ring arranged on the top end of the second structure member; the forth lantern ring engages with the second lantern ring, and the screw is in clearance fit with the fourth lantern ring after being connected to threads of the second lantern ring.

2. The supporting base seat according to claim 1, wherein the first structure member and the second structure member are triangular plate-shaped structures.

3. The supporting base seat according to claim 1, wherein the first structure member and the second structure member are L-shaped, an angle formed between two arms of the first structure member is an acute angle, and an angle formed between two arms of the second structure member is equal to the angle formed between the two arms of the first structure member.

4. The supporting base seat according to claim 1, wherein a first gasket is arranged between the first lantern ring and the third lantern ring, and a second gasket is arranged between the second lantern ring and the forth lantern ring.

5. The supporting base seat according to claim 1, further comprising a decoration strip, the decoration strip is connected between the first clamping hook and the second clamping hook, a first clamping groove and a second clamping groove are respectively arranged in two ends of the decoration strip, the first clamping hook is clamped in the first clamping groove, and the second clamping hook is clamped in the second clamping groove.

6. The supporting base seat according to claim 5, wherein a first spring clamping column is arranged at the first clamping groove, a third clamping groove is arranged at a side of the first clamping hook corresponding to the first spring clamping column, and the first spring clamping column extends into the third clamping groove when the first clamping hook is clamped in the first clamping groove;
    a second spring clamping column is arranged at the second clamping groove, a forth clamping groove is arranged at a side of the second clamping hook corresponding to the second spring clamping column, and the second spring clamping column extends into the forth clamping groove when the second clamping hook is clamped in the second clamping groove.

7. The supporting base seat according to claim 1, wherein magnets are respectively arranged on the top ends of the first structure member and the second structure member.

8. The supporting base seat according to claim 1, wherein a first clamping hole and a first rubber cushion being in interference fit with the first clamping hole are respectively arranged at bottom parts of the first structure member and the second structure member, a second clamping hole and a second rubber cushion being in interference fit with the second clamping hole are respectively arranged above the first clamping hook and the second clamping hook.

9. A flat-panel display device, comprising a display panel, wherein the flat-panel display device further comprises a supporting base seat, the supporting base seat comprises a first structure member and a second structure member; shapes of the first structure member and the second structure member are symmetrical, and the first structure member is hinged to the second structure member in an axial symmetrical mode; a first hinging portion is arranged on a bottom rear side of the first structure member and a bottom rear side of the second structure member; a second hinging portion is arranged at a top end of the first structure member and a top end of the second structure member, and a maximum hinged included angle is smaller than 180 degrees; the supporting base seat is a triangular cone-shaped frame structure when unfolded; a first clamping hook extends out of a bottom front side of the first structure member, and a second clamping hook extends out of a bottom front side of the second structure member;
    wherein, the first hinging portion comprises a door pivot that is an elastic mechanism, a first lantern ring arranged on of the bottom rear side of the first structure member, and a third lantern ring arranged on the bottom rear side of the second structure member; the third lantern ring engages with the first lantern ring, and the door pivot extends through the first lantern ring and the third lantern ring;
    the second hinging portion comprises a screw, a second lantern ring arranged on the top end of the first structure member, and a forth lantern ring arranged on the top end of the second structure member; the forth lantern ring engages with the second lantern ring, the screw is in clearance fit with the fourth lantern ring after being connected to threads of the second lantern ring.

10. The flat-panel display device according to claim 9, wherein the first structure member and the second structure member are triangular plate-shaped structures.

11. The flat-panel display device according to claim 9, wherein the first structure member and the second structure member are L-shaped, an angle formed between two arms of the first structure member is an acute angle, and an angle formed between two arms of the second structure member is equal to the angle formed between the two arms of the first structure member.

12. The flat-panel display device according to claim 9, wherein a first gasket is arranged between the first lantern ring and the third lantern ring, and a second gasket is arranged between the second lantern ring and the forth lantern ring.

13. The flat-panel display device according to claim 9, further comprising a decoration strip, the decoration strip is connected between the first clamping hook and the second clamping hook, a first clamping groove and a second clamping groove are respectively arranged in two ends of the decoration strip, the first clamping hook is clamped in the first clamping groove, the second clamping hook is clamped in the second clamping groove.

14. The flat-panel display device according to claim 13, wherein a first spring clamping column is arranged at the first clamping groove, a third clamping groove is arranged at a side of the first clamping hook corresponding to the first spring clamping column, and the first spring clamping column extends into the third clamping groove when the first clamping hook is clamped in the first clamping groove;
    a second spring clamping column is arranged at the second clamping groove, a forth clamping groove is arranged at a side of the second clamping hook corresponding to the second spring clamping column, and the second spring clamping column extends into the forth clamping groove when the second clamping hook is clamped in the second clamping groove.

15. The flat-panel display device according to claim 9, wherein two magnets are respectively arranged on the top ends of the first structure member and the second structure member.

16. The flat-panel display device according to claim 9, wherein a first clamping hole and a first rubber cushion being in interference fit with the first clamping hole are respectively arranged at bottom parts of the first structure member and the second structure member; a second clamping hole and a second rubber cushion being in interference fit with the second clamping hole are respectively arranged above the first clamping hook and the second clamping hook.

* * * * *